United States Patent
Patapoutian et al.

(10) Patent No.: US 6,691,278 B1
(45) Date of Patent: Feb. 10, 2004

(54) DETECTING ERRORS IN CODED BIT STRINGS

(75) Inventors: Ara Patapoutian, Westborough, MA (US); Ba-Zhong Shen, Shrewsbury, MA (US); Peter McEwen, Santa Clara, CA (US); Michael Leis, Framingham, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/418,210

(22) Filed: Oct. 13, 1999

(51) Int. Cl.[7] .................. G06F 11/00; H03M 13/00; G11C 29/00
(52) U.S. Cl. .................. 714/801; 714/785; 714/805
(58) Field of Search .................. 714/801, 805, 714/765, 777, 785, 756, 761, 763, 781, 753, 792, 793, 794; 360/795, 40, 27, 29, 42

(56) References Cited

U.S. PATENT DOCUMENTS

| | | | | |
|---|---|---|---|---|
| 4,476,562 A | * | 10/1984 | Sako et al. | 714/756 |
| 4,775,979 A | * | 10/1988 | Oka | 714/761 |
| 4,939,733 A | * | 7/1990 | Furutani | 714/765 |
| 5,257,272 A | | 10/1993 | Fredrickson | 714/792 |
| 5,563,894 A | * | 10/1996 | Fujiwara et al. | 714/785 |
| 5,745,507 A | * | 4/1998 | Chen | 714/763 |
| 5,862,005 A | | 1/1999 | Leis et al. | 360/27 |

OTHER PUBLICATIONS

Bahl et al., "Optimal decoding of linear codes for minimizing symbol error rate", IEEE Trans. on Information Theory, 1974.

Forney et al., "The Viterbi algorithm", Proceedings of the IEEE, 61:3, 1973.

Gilbert "Capacity of u burst–noise channel" The Bell System Technical Journal, pp. 1253–1265, 1960.

Kanak et al., "Models for channels with memory and their applications to error control" Proceedings of the IEEE, 66:7, 1978.

Kuznetsov et al., "On the undetected error probability of Linear block codes on channels with memory", IEEE Trans. Info. Theory, 42:1, 1996.

Viterbi et al., "Principles of Digital Communication and Coding"MC–GxawHills, 1979.

Wolf et al., "Efficient maximum likelihood decoding of linear block codes using a trellis" 24:1, 1978.

Wolf et al., "The single burst error detection performance a binary cyclic codes", IEEE Trans. Comm. Theory, 42:1, 1994.

* cited by examiner

*Primary Examiner*—Emmanuel L. Moise
(74) *Attorney, Agent, or Firm*—Daly, Crowley & Mofford, LLP

(57) ABSTRACT

A parity check matrix is generated for detecting predefined errors in a coded string of bits. A column of the matrix is generated by selecting values for elements in the column and processing a predefined error with the selected values in order to produce a syndrome. The selected values are assigned to the column of the parity check matrix if an element of the syndrome has a value indicative of the predefined error.

61 Claims, 7 Drawing Sheets

US 6,691,278 B1

DETECTING ERRORS IN CODED BIT STRINGS

BACKGROUND OF THE INVENTION

This invention relates generally to detecting errors in coded bit strings.

Data storage systems, such as disk drives, are prone to various errors that can corrupt data. For example, media and electronic noise can change the content of a magnetic disk, and thereby produce an error. Such errors are not unique to data storage systems. Rather, any system that stores, retrieves, and/or transmits data (e.g., a communication system) is at risk of such errors.

Coding techniques were therefore developed to facilitate detection, and in some cases correction, of data errors. One such coding technique adds parity bits to the data before it is stored or transmitted. A device receives the data and, based on the parity bits, determines if there are errors in the data. Only errors of a particular length, such as one-bit errors, can be detected efficiently using these codes.

Coding techniques which go one step further, and correct errors in the data, require a large number of parity bits. The more parity bits that are used, however, the less storage space/bandwidth can be used for data bits.

SUMMARY OF THE INVENTION

One aspect of the invention relates to detecting and/or correcting predefined errors having various bit (1,0) combinations and lengths. In particular, a parity check matrix is generated that is used to detect the predefined errors based on parity bits in the data. A generation matrix is developed from the parity check matrix for adding the parity bits to the data.

In this aspect, values for elements in a column of the parity check matrix are selected. A predefined error is processed with the selected values in order to produce a syndrome matrix. The selected values are assigned to the column of the parity check matrix if an element of the syndrome has a value indicative of the predefined error.

By including values in the parity check matrix that produce a syndrome element indicative of the predefined error, it is possible to ensure that the parity check matrix can be used detect that error. Doing this for each error in a list of predefined errors produces a parity check matrix that can detect all errors in the list. This can be done for any list of errors, including errors having different lengths. Coding can be performed using a simple variant of the parity check matrix.

One or more of the following features/functions may also be included in this aspect.

Processing the predefined error with the selected value may comprise multiplying the predefined error by the selected value. If a selected element has a value that is not indicative of a predefined error, different values are selected for the elements. The different values are processed with the predefined error to produce a new syndrome, and the different values are assigned to the column of the parity check matrix if the syndrome has a value indicative of the predefined error. A new predefined error may also be selected, and the foregoing process repeated for the new predefined error.

The selecting, processing and assigning described above start at a last column of the parity check matrix and proceed, column-by-column, to a first column of the parity check matrix. The predefined error is included in an n-bit (n>1) string when the predefined error is processed with the selected values. The predefined error is moved to a different location in the n-bit string when it is processed with a different column of the parity check matrix.

Values for elements in the column comprise bit combinations that are possible for the column. The values are selected for the column by selecting each possible bit combination, in turn, for processing. A generation matrix for coding strings of bits is determined from the parity check matrix. A decoder comprised of logic gates is used to generate the parity check matrix.

In another aspect of the invention, a predefined error in a coded string of bits is detected by generating a parity check matrix based on the predefined error, and processing the string with the parity check matrix to produce a syndrome having one or more elements. It is then determined if the syndrome has an element that is indicative of the predefined error.

One or more of the following features/functions may also be included in this aspect.

An element $h_i$ ($i \geq 1$) in a column of the parity check matrix is selected such that:

$$h_i \neq \sum_{k=2}^{\min(l_j, n-i)} h_{i+k-1} e_{jk} \quad \text{for } 1 \leq j \leq M,$$

where l is a number of bits in an error, n is a number of bits in the coded string, M is a number of errors, and e is a bit in the error. A portion of the parity check matrix comprises an identity matrix.

In another aspect, a string of bits is coded to permit detection of predefined errors. A parity check matrix is generated which detects the predefined errors, and a generation matrix is determined from the parity check matrix. The string of bits is then processed with the generation matrix.

In another aspect, an error detection code ("EDC") is used to correct a coded bit string. This is done by receiving data for the coded bit string, and determining distances between the data and bit combinations corresponding to the data. A bit combination is selected, to substitute for the data, that is permitted by the error detection code and that has a minimum distance. By using an EDC to perform error correction in this manner, error correction is performed with relatively few bits.

One or more of the following features/functions may also be included in this aspect. The error detection code requires that a number of bits in the coded bit string comply with a condition. The condition may be that the coded bit string have an even number of ones.

This brief summary has been provided so that the nature of the invention can be understood quickly. A detailed description of illustrative embodiments of the invention is set forth below.

DESCRIPTION OF THE PREFERRED EMBODIMENT

Figure 1:
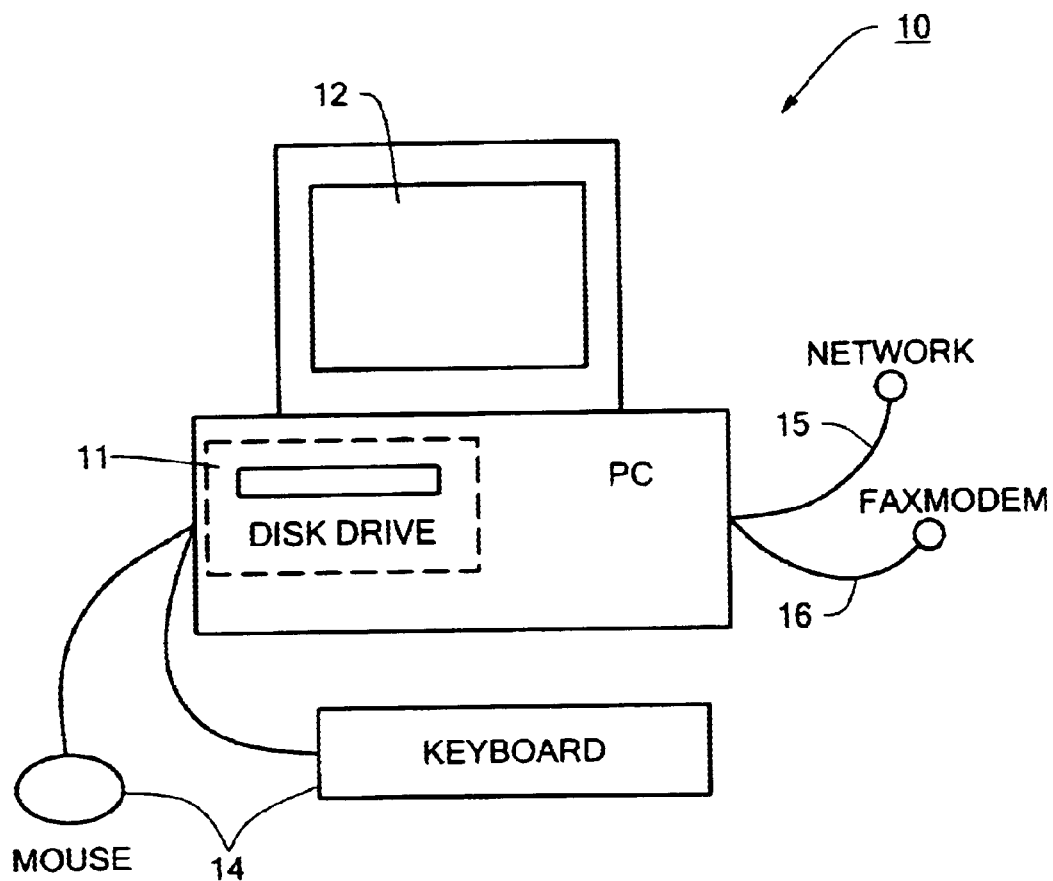
FIG. 1 is a perspective view of a computer.

FIG. 1 shows a personal computer ("PC") 10. PC 10 includes a disk drive 11 which codes and decodes bit strings, a display screen 12 which displays information to a user, and input devices 14 which input data. Network interface 15 and fax/modem interface 16 are also provided which connect PC 10 to a network.

Figure 2:
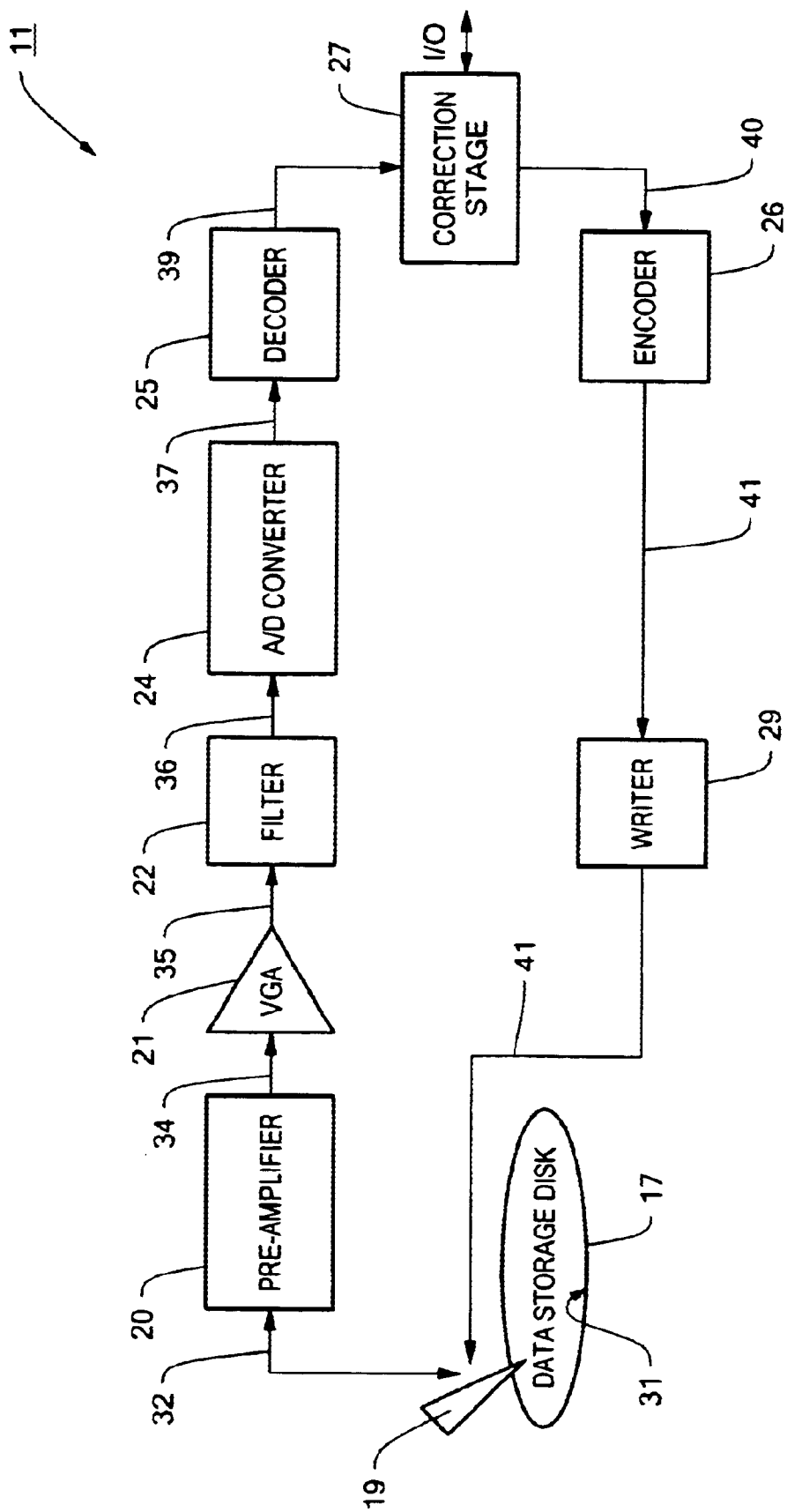
FIG. 2 is a block diagram of a disk drive included in the computer.

FIG. 2 shows components of disk drive 11. Among the components of disk drive 11 are data storage disk 17, transducer head 19, pre-amplifier 20, analog variable gain amplifier ("VGA") 21, filter 22, analog-to-digital ("A/D") converter 24, decoder 25, encoder 26, second correction stage 27, and writer 29.

Figure 3:
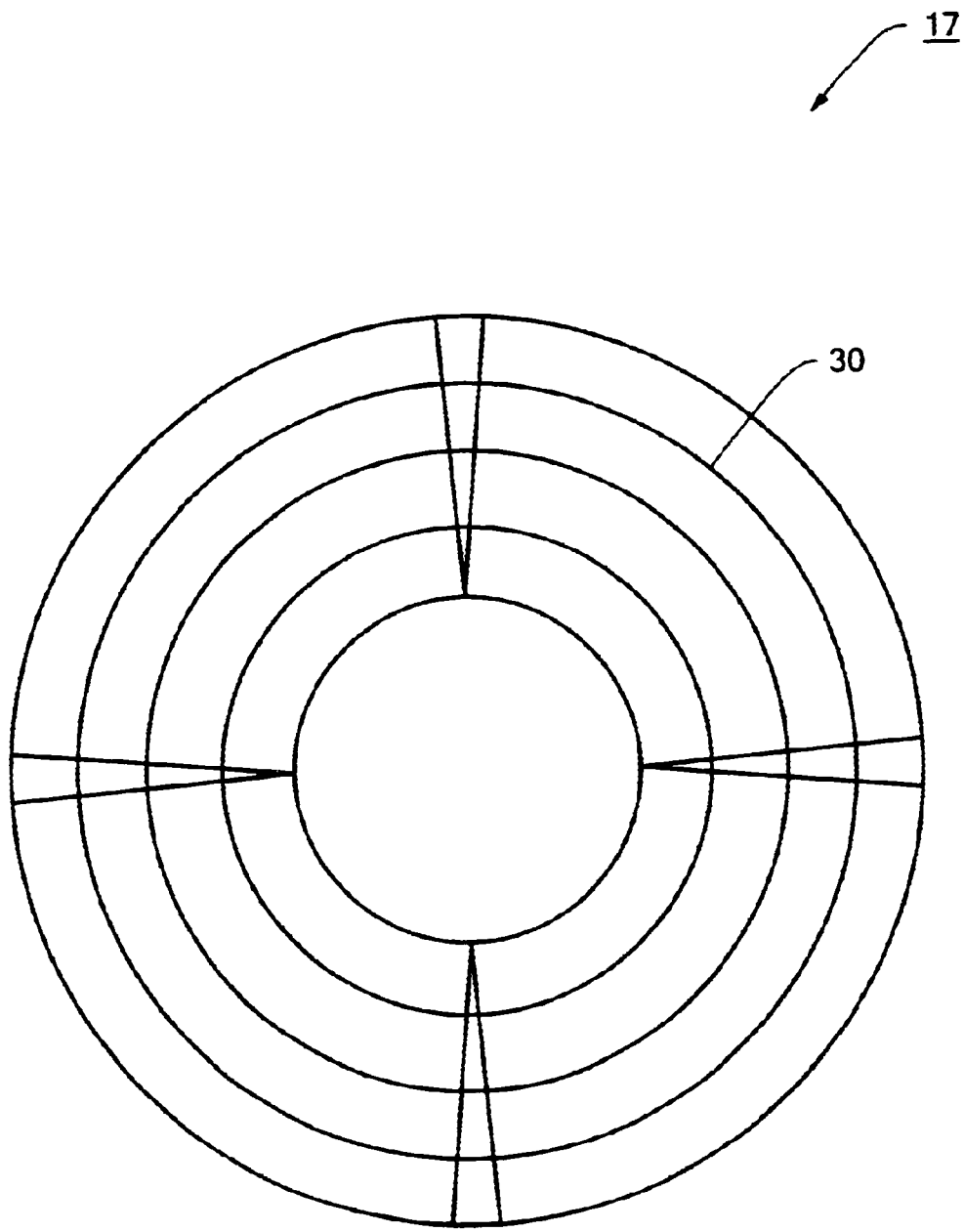
FIG. 3 is a top view of a data storage disk in the disk drive.

Data storage disk 17 is a magnetic disk having concentric data storage channels defined on each of its storage surfaces. A close-up view of these channels 30 is shown in FIG. 3. Data storage disk 17 is rotated inside disk drive 11 while data is read from/written to its channels. Although only one data storage disk 17 is shown, more than one disk may be included in disk drive 11.

Transducer head 19 may be a giant magneto-resistive head ("GMR") (or similar device) that is capable of reading data from, and writing data to, data storage disk 17. Transducer head 19 is associated in a "flying" relationship over a storage surface 31 of disk 17, meaning that it is movable relative to, and over, storage surface 31 in order to read and write data.

During reading, head 19 senses flux transitions as it "flies" in close proximity to a selected channel on disk 17. These flux transitions 32 are provided to pre-amplifier 20. Pre-amplifier 20 is a voltage pre-amplifier that amplifies the flux transitions from millivolts (mV) to volts (V). The resulting pre-amplified analog signal (or "read" signal) 34 is provided to VGA 21. VGA 21 further amplifies read signal 34 and provides a resulting amplified read signal 35 to filter 22.

Filter 22 is an analog filter/equalizer that generates a substantially square wave from amplified read signal 35. To this end, filter 22 is programmed in accordance with the data transfer rate of a data zone on disk 17 from which signal 35 ultimately originated. Resulting filtered signal 36 is subjected to sampling and quantization within high-speed A/D converter 24. A/D converter 24 outputs digital data 37 generated from signal 36. Data 37 represents data stored on disk 17, and is "soft", meaning that it contains quantized voltage values that may not be exactly one or zero (for example, a zero value may be "0.25" instead of actually "0").

Data stored on disk 17 is coded prior to storage using an error detection code ("EDC"), which means that data 37 is also coded. Decoder 25 uses a Viterbi detector to correct errors in data 37 based on the EDC and to correct intersymbol ("ISI") interference. In alternative embodiments, where a slicer is included between A/D converter 24 and decoder 25 to make data 37 "hard" (meaning that it contains one and zero values), the decoder uses the EDC only to detect errors in incoming data.

Encoder 26 receives data 40 from second correction stage 27, and adds the EDC to data 40 before it is stored on data storage disk 17. Basically, encoder adds parity bits to data 40 using matrix multiplication. The encoding process is described below. Writer 29 is circuitry for writing coded data 41 to channels on data storage disk 17.

Figure 4:
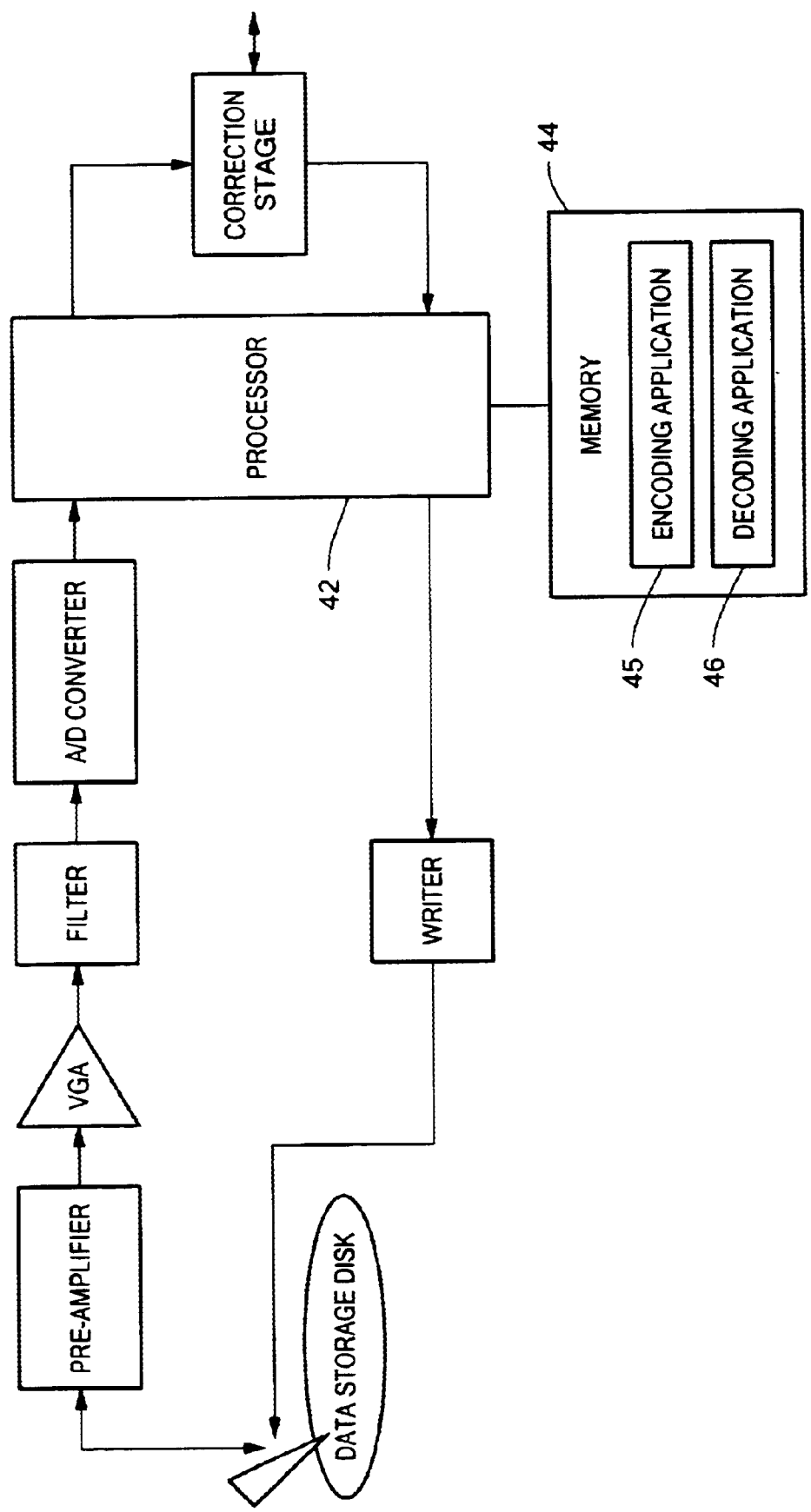
FIG. 4 is a block diagram of an alternative embodiment of the disk drive.

Encoder 26 and decoder 25 may be implemented in hardware, such as logic gates (NOR, AND, OR), or in software. The hardware implementation is shown in FIG. 2. In a software implementation, the functions of encoder 26 and decoder 25 are implemented using a processor 42 and memory 44 (see FIG. 4). For example, memory 44 stores encoding application 45 and decoding application 46, which are executed by processor 42 to perform the encoding and decoding processes described below. More than one processor and/or memory may be used in the disk drive of FIG. 4.

Second correction stage 27 is a Reed-Solomon error correction decoder that corrects errors in data 39 that were not corrected by decoder 25. From second correction stage 27, data is output to, e.g., a controller (not shown) in computer 10, which processes the data and provides it to display screen 12, network interface 15, and/or fax/modem interface 16. Second correction stage 27 also receives data from an external source (such as the controller) and provides that data to encoder 26.

I. Error Detection

Encoder 26 uses a generation (or "G") matrix to code data 40, and decoder 25 uses a parity check (or "H") matrix to detect/correct errors in coded data 37. Specifically, encoder 26 multiplies data 40 by the G matrix to produce coded data 41. In embodiments where decoder 25 receives "hard" data, decoder 25 multiplies the coded data by the H matrix to detect errors therein. In embodiments where decoder 25 receives "soft" data, decoder 25 uses a Viterbi detector, generated from the H matrix, to correct errors in the data. The Viterbi detector may be generated in decoder 25 or provided to decoder 25. Generation of a Viterbi detector from an H matrix is well know, as described in Wolf, Jack E., "Efficient Maximum Likelihood Decoding Of Linear Block Codes Using A Trellis", IEEE Transactions on Information Theory (January 1978), the contents of which are hereby incorporated by reference.

The G matrix is determined from the H matrix; therefore, a process for generating the H matrix is described first.

A. Determining the H Matrix

The H matrix is designed to detect one or more predefined error types. These error types represent the difference between an expected channel output and an actual channel output (if there were no errors, the difference would be zero). Each error type is a combination of one or more bits that has been selected based on its probability of occurrence. For example, error types of [101], [11], and [1] may be highly probable for a particular memory channel due, e.g., to specific characteristics of the channel. The H matrix therefore may be designed to detect any of these error types. Other error types may occur. Such errors may be detected and corrected using other means, such as second correction stage 27 described above.

The H matrix may be designed to detect any number of error types, and an error type may include any number of bits. However, since this embodiment is best illustrated by way of example, the following describes generating an H matrix for error types [101], [11], and [1]. Henceforth, these are referred to as the "sample" error types.

First, the size of the H matrix is determined. The size is based, in part, on the number of parity bits in each coded bit string. The number of error types that are to be detected dictates the number of parity bits that must be added (by the G matrix) to code a bit string. Specifically, the number of parity bits, r (r≧1), is determined as follows $$r = \log_2 (M+1), \quad (1)$$

where M is the number of error types to be detected.

The number of rows in the H matrix is set equal to the number of parity bits r. The number of columns in the H matrix is set equal to the number n (n≧1) of bits in a coded bit string. This is done in order to permit matrix multiplication (see below). The value of n is determined by $$n = k + r \quad (2)$$

where k (k≧1) is the number of bits in an uncoded bit string and r is as defined above.

For the sample error types, M has a value of three. The value of r is determined by $$r = \log_2 (3+1) = 2. \quad (3)$$

The H matrix to detect the sample error types will therefore have two rows. Assuming, for example, that n is five (decoder 25 can be programmed with this value), the H matrix to detect the sample error types will be a 2×5 matrix, as follows $$H = \begin{vmatrix} x & x & x & x & x \\ x & x & x & x & x \end{vmatrix}, \quad (4)$$

where "x" indicates an unknown element value.

The elements of the H matrix are next determined. These values are set so that the resulting H matrix can detect the predefined error types in an n-length bit string. For the sample error types, this means that the H matrix will be able to detect [101], [11], and [1] at whatever point those error types occur in a five-bit string (e.g., [01010], [10100], [00001], [01100] and so on).

Figure 5:
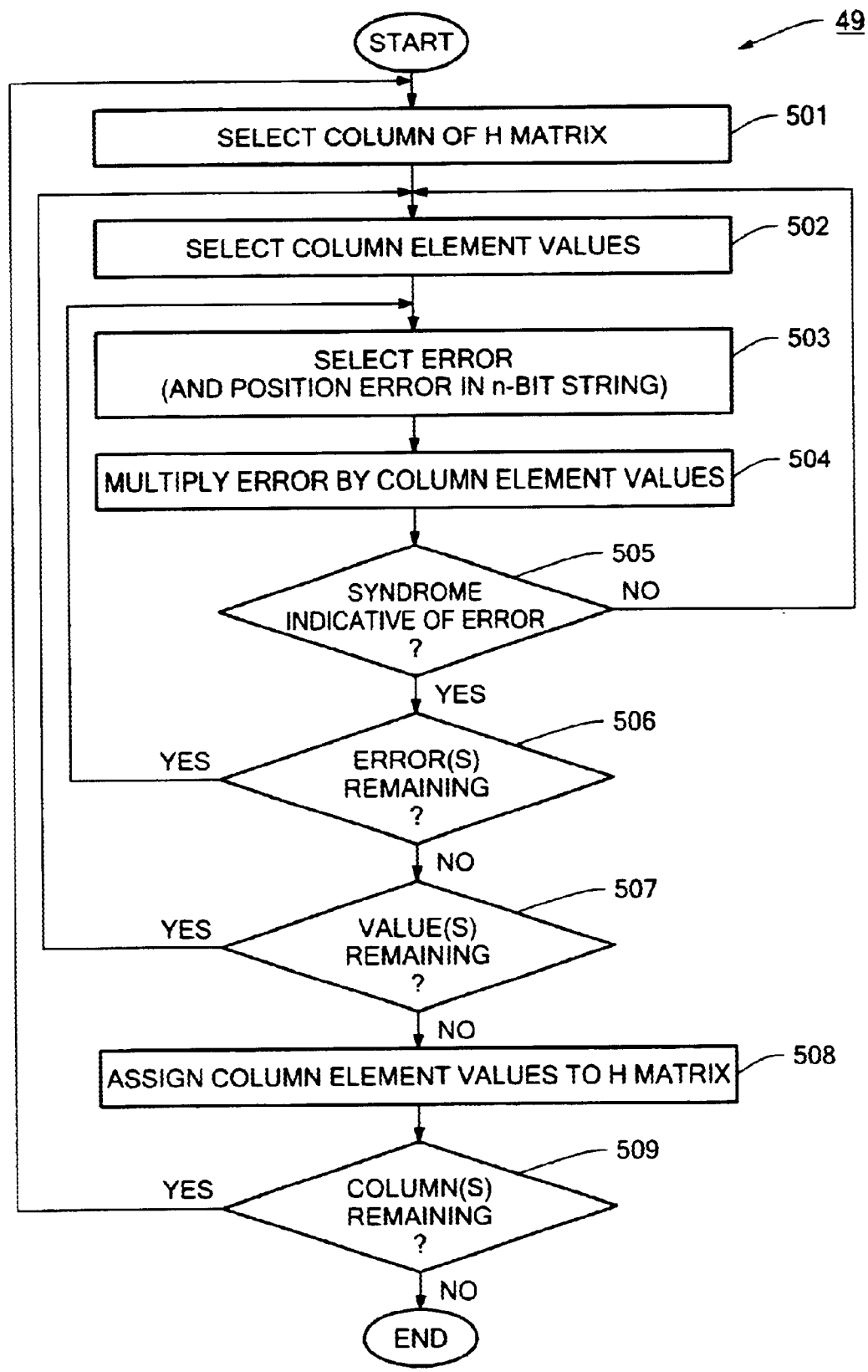
FIG. 5 is a flow diagram showing a process for determining an error detection (parity check) matrix.

FIG. 5 shows a process 49 for determining values for the elements of the H matrix based on the predefined error types. Process 49 may be performed by decoder 25 "on-the-fly", in which case decoder 25 automatically generates the H matrix for each new set of error types provided to decoder 25. Alternatively, process 49 may be performed "off-line", in which case the H matrix is generated outside of decoder 25 and then provided (e.g., downloaded) to decoder 25.

Here, process 49 is described with respect to the H matrix used to detect the sample error types (equation 4). In step 501, process 49 selects a column of the H matrix. Process 49 is recursive in the sense that it selects the last column of the H matrix and works its way back, column-by-column, to the first column of the H matrix.

So, starting with the last column (in this case column five), in step 502, process 49 selects column element values for column five. Any possible bit combination may be selected. For example, since there are two elements per column in the H matrix, the possible bit combinations for each column are [0,0], [0,1], [1,0], and [1,1]. Process 49 selects each of these bit combinations, in turn, and tests if each bit combination produces a value indicative of an error for each of the sample error types. These bit combinations may be selected in any order.

To test bit values for a column of the H matrix, process 49 selects (503) an error (e.g., [101]), positions the error within an n-length bit string, and processes (e.g., multiplies) (504) the n-length bit string (with the error) with the selected bit values. If the resulting processing produces a matrix (called a "syndrome") having at least one element indicative of an error (for example, an element with a value of one), then the selected values can (but need not) be assigned to the current column (since the n-length string includes an error, the resulting value must indicate an error). If the resulting processing produces a syndrome having element values which do not indicate an error (for example, all elements have values of zero), then the selected values cannot be assigned to the current column (otherwise, process 49 will indicate no error when, in fact, there is an error).

In the current example, n is five; therefore, each sample error type is positioned within a five-bit string having all zero values except for any "one" values present in a sample error. The positioning of the error type within the five-bit string depends upon the column being tested. For a first column of the H matrix, the most significant bit ("MSB") of each sample error type is set as the least significant bit ("LSB") of the five-bit string. For the second column of the H matrix, each sample error type is "shifted" left in the five-bit string, such that the MSB of each error type is the second LSB in the five-bit string, and so on.

Table 1 below shows the positioning of each of the sample error types within a five-bit string for multiplication by a corresponding column of the H matrix, where column "5" is the last column of the H matrix and column "1" is the first column of the H matrix.

TABLE 1

| Error | Column 1 | Column 2 | Column 3 | Column 4 | Column 5 |
|-------|----------|----------|----------|----------|----------|
| 101   | 10100    | 01010    | 00101    | 00010    | 00001    |
| 11    | 11000    | 01100    | 00110    | 00011    | 00001    |
| 1     | 10000    | 01000    | 00100    | 00010    | 00001    |

Assume, for example, that the last column (column five) of the H matrix is selected in step 501, [0,0] column element values are selected in step 502, and sample error type [101] is selected in step 503. In this case, in step 504, [00001] (from [101] and column five of Table 1) is processed with (e.g., multiplied by) the H matrix with [0,0] column element values added to column five thereof. In the processing, the transpose of H ($H^T$) is used, as shown below $$[0\ 0\ 0\ 0\ 1] \cdot \left( H^T = \begin{vmatrix} x & x \\ x & x \\ x & x \\ x & x \\ 0 & 0 \end{vmatrix} \right) = [0\ 0] \quad (5)$$

Galois field binary arithmetic is used in the matrix multiplication of equation 5 in order to ensure that each element of the resulting syndrome is a single-digit number. The rules for Galois field binary arithmetic are set forth in Table 2.

TABLE 2

| Addition | Multiplication |
|----------|----------------|
| 0 + 0 = 1 | 0 × 0 = 0 |
| 0 + 1 = 1 | 0 × 1 = 0 |
| 1 + 0 = 1 | 1 × 0 = 0 |
| 1 + 1 = 0 | 1 × 1 = 1 |

In the matrix multiplication of equation 5, zeros in the [00001] five-bit string (with error) cancel out the unknowns (i.e., the x's) in $H^T$. This leaves, as element values for the syndrome [1×0, 1×0], or [0,0]. Since an error is present in the five-bit string [00001], element values [0,0] cannot be added to column five of the H matrix. This is because element values [0,0] produce a syndrome [0,0] that is not indicative (step 505) of an error. New column element values are therefore selected in step 502. i Steps 502 to 504 are then repeated for column five using these new column element values.

Assume new element values [0,1] are selected in step 502, and that error [101] is selected in step 503. In this case, multiplication in step 504 produces a syndrome of [1,0]. This syndrome includes an element value of [1], which is indicative (step 505) of an error for [101]. However, the other error types must also be tested, since [1,0] has not been tested for all sample error types (errors remain in step 506). For each other sample error [11] and [1], the five-bit string for column 5 (from Table 1) is the same as for [101]. Therefore, column element values [0,1], [1,0] and [1,1] all produce a syndrome indicative of an error for all errors. Accordingly, any of [0,1], [1,0] and [1,1] may be assigned, in step 508, to column five of the H matrix. Thus, process 49 can produce more than one H matrix to detect the same set of errors.

For reasons noted below, in step 508, process 49 assigns element values [0,1] to column five of the H matrix, as shown below $$H = \begin{vmatrix} x & x & x & x & 0 \\ x & x & x & x & 1 \end{vmatrix}. \tag{6}$$

After all error types have been checked against all column element values for column 5, process 49 proceeds to step 509. Since element values for columns one to four of the H matrix have not yet been determined, process 49 proceeds from step 509 to step 501, where it selects the next column in the H matrix. This is column four.

For column four, [0,0] values are selected in step 502, and sample error type [101] is selected in step 503. Thus, [00010] (the five-bit string from Table 1 for sample error [101] in column four) is multiplied in step 504 by $H^T$ with the [0,0] values added to column four of H:

$$[0\ 0\ 0\ 0\ 1] \cdot \begin{vmatrix} x & x \\ x & x \\ x & x \\ 0 & 0 \\ 1 & 0 \end{vmatrix} = [0\ 0]. \tag{7}$$

As shown in equation 7, the resulting syndrome for element values (0,01 includes all zeros. That is, zeros in the five-bit string (with error) cancel out the x's in $H^T$. This leaves, for the syndrome $$[1.0+0.1,\ 1.0+0.0] = [0,0]. \tag{8}$$

Since zero values are not indicative (step 505) of an error, and since an error is present in the bit string, [0,0] cannot be used as element values in column four of the H matrix. Accordingly, new values are selected in step 502. Steps 503 to 505 are then repeated for column four using these new values.

Assume new column element values of [1,0] are selected in step 502, and that sample error type [101] is selected in step 503. In this case, multiplication in step 504 produces a syndrome of [0,1]. This syndrome includes a [1], which is indicative (step 505) of an error for [101]. However, column element values [0,1] must be tested for the other sample error types [11] and [1] per step 506. For these other error types, their column four, five-bit strings from Table 1 are tested for element values [0,1]. Both strings result in a syndrome having at least one value of [1] for column element values [0,1]. Therefore, [0,1] may be assigned to column four of the H matrix. Following the same process, it is determined that [1,1] can also be assigned to column four, but that [0,1] cannot be assigned to column four.

For reasons noted below, in step 508, process 49 assigns [1,0] to column four of the H matrix, as shown below $$H = \begin{vmatrix} x & x & x & 1 & 0 \\ x & x & x & 0 & 1 \end{vmatrix}. \tag{9}$$

Since columns one to three of the H matrix (equation 9) have not yet been determined (i.e, columns remain in step 509), process 49 selects the next column in the H matrix in step 501. This is column three.

For column three, [0,0] values are selected in step 502, and sample error type [101] is selected in step 503. Thus, [00101] (the five-bit string from Table 1 for sample error [101] in column three) is multiplied in step 504 by $H^T$ with [0,0] element values added to column three of H:

$$[0\ 0\ 1\ 0\ 1] \cdot \begin{vmatrix} x & x \\ x & x \\ 0 & 0 \\ 0 & 1 \\ 1 & 0 \end{vmatrix} = [0\ 0]. \tag{10}$$

In the matrix multiplication of equation 10, zeros in the [00101] five-bit string (with error) cancel out the x's in $H^T$. This leaves a [0,0] value for the syndrome. Since zero values are not indicative (step 505) of an error, column element values [0,0] cannot be used for column three of the H matrix. New column element values are selected in step 502. Steps 503 to 505 are repeated for these new values.

Of remaining column element values [0,1], [1,0] and [1,1], only [1,1] produces a syndrome with a [1] value for all three sample errors. Accordingly, [1,1] is assigned, in step 508, to column three of the H matrix, as follows $$H = \begin{vmatrix} x & x & 1 & 1 & 0 \\ x & x & 1 & 0 & 1 \end{vmatrix}. \tag{11}$$

Since columns one and two of the H matrix have not yet been determined (i.e, columns remain in step 509), process 49 selects the next column in the H matrix. This is column two. Thereafter, the foregoing process is repeated for columns two and one until the H matrix is complete.

As noted above, more than one matrix may be produced for a given set of error types. One complete H matrix that can be used to detect the sample error types in a five-bit coded bit string is the following:

$$H = \begin{vmatrix} 1 & 0 & 1 & 1 & 0 \\ 0 & 1 & 1 & 0 & 1 \end{vmatrix}. \tag{12}$$

Examination of the H matrix of equation 12 reveals that the last 2×2 (more generally, r×r) block of the H matrix is the identity matrix I, where $$I = \begin{vmatrix} 1 & 0 \\ 0 & 1 \end{vmatrix}. \quad (13)$$

This is true of any systematic linear code, meaning a code in which the parity bits are segregated at one end of the bit string or not otherwise not intermingled with information bits in the bit string.

In light of the foregoing, to design an H matrix for a systematic linear code, $I_r$ (the I matrix for r parity bits), may be added automatically to the last r×r block of the H matrix. Thus, only the first n−r columns need to be calculated using above process 49. This can reduce processing time and simplify determination of G (see below).

Stated generally, for a systematic linear code, each element hi (i≧1) of the first n−r columns of the H matrix satisfies $$h_i \neq \sum_{k=2}^{\min(l_j, n-i)} h_{i+k-1} e_{jk} \quad \text{for } 1 \leq j \leq M, \quad (14)$$

where l is a length (number of bits) of an error, e is a bit in the error, and M and n are as defined above.

B. Determining the G Matrix

Once the H matrix has been generated, the G matrix is determined from the H matrix. If the H matrix is determined "on-the-fly" by decoder 25, the G matrix may also be determined by decoder 25 and then provided to encoder 26. Alternatively, the G matrix may be determined "off-line" and provided to encoder 26; or the H matrix may be provided to encoder 26, which may determine the G matrix itself.

1. Systematic Linear Code

Figure 6A:
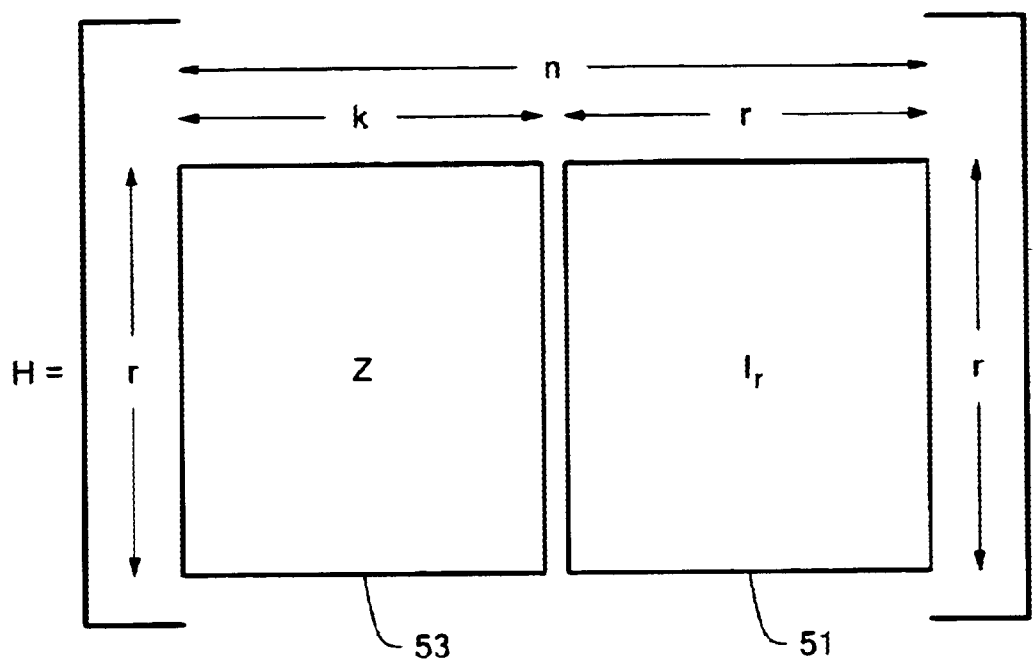
FIGS. 6a and 6b are block diagrams showing a parity check matrix and a generation matrix determined therefrom.
Figure 6B:
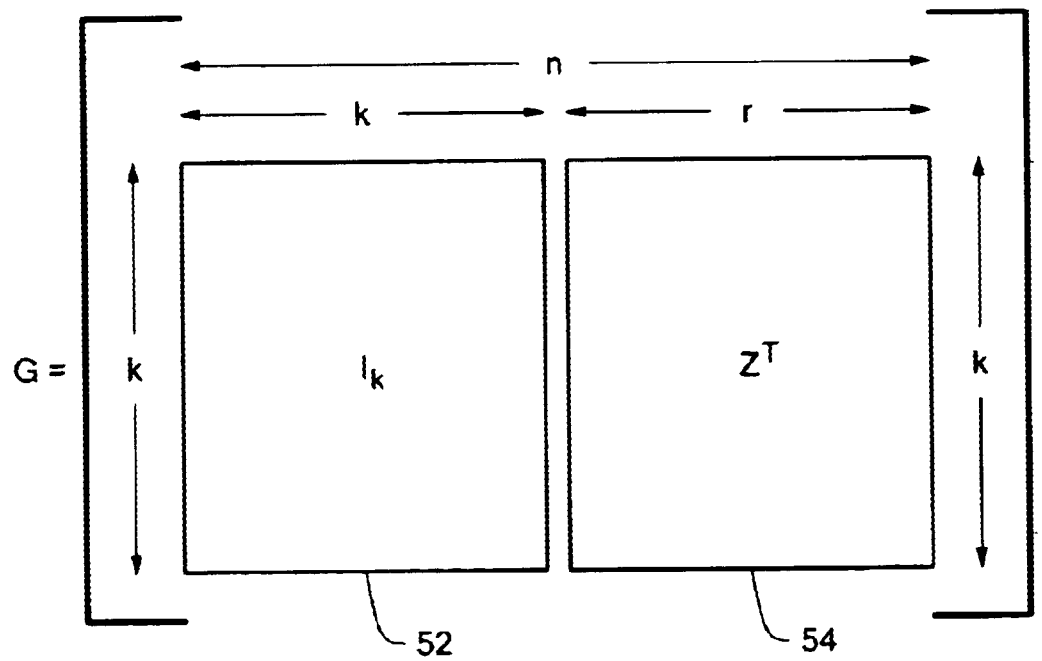

G matrix determination for a systematic linear code is addressed first. For an n×r H matrix in which the last r×r block 51 is the I matrix (see FIG. 6a), the G matrix is determined by setting the first k columns to the I matrix 52, taking the transpose of the first k columns [Z] 53 of the H matrix, and setting $Z^T$ 54 (where $Z^T$ is Z transpose) as the last r columns of the G matrix (see FIG. 6b). Accordingly, for the H matrix of equation 12, the corresponding G matrix is $$G = \begin{vmatrix} 1 & 0 & 0 & 1 & 1 \\ 0 & 1 & 0 & 0 & 1 \\ 0 & 0 & 1 & 1 & 0 \end{vmatrix}. \quad (15)$$

2. Non-Systematic Linear Code

For a non-systematic linear code, the G matrix is determined as follows. A matrix Q is defined based on an n×r H matrix, such that $$Q = \begin{vmatrix} H & I_r \\ I_n & 0 \end{vmatrix}, \quad (16)$$

where $I_n$ and $I_r$ are the identity matrix I, with n×n elements and r×r elements, respectively. As above, r is the number of parity bits in an n-bit coded bit string.

Gaussian elimination is performed on the Q matrix to make the last r columns of the H matrix in Q equal to the identity matrix $I_r$. As a result of the gaussian elimination performed to achieve this result, the H matrix is transformed into $H_s$ in Q. $H_s$ is an n×r matrix in Q (at the same location as H), the first n−r columns of which are defined as the parity matrix P, and the last r×r columns of which are $I_r$. Parity matrix P corresponds to parity bits to be added to bit strings during coding using the G matrix.

The upper-right r×r block of Q is designated as matrix A, the bottom-left n×n block of Q is designated as matrix B, and the remaining bottom right block of Q is not used and, therefore is designated as matrix x. This is shown below in equation 17, $$Q = \begin{vmatrix} H_s & A \\ B & x \end{vmatrix} = \begin{vmatrix} PI_r & A \\ B & x \end{vmatrix}, \quad (17)$$

where, by definition $$H_s = A \cdot H \cdot B. \quad (18)$$

The G matrix is determined from the I, P and B matrices, as follows $$G = |I_k P^T| \cdot B^T, \quad (19)$$

where k is the number of bits in an uncoded bit string, and so that $$G \cdot H^T = [0]. \quad (20)$$

Equations 16 to 20 can also be used to determine the G matrix for systematic linear codes. However, this process is more computationally intensive than that described above with respect to FIGS. 6a and 6b.

An example of determining the G matrix is now provided for $$H = \begin{vmatrix} 1 & 0 & 1 & 0 & 1 \\ 1 & 1 & 1 & 1 & 0 \\ 1 & 0 & 1 & 0 & 0 \end{vmatrix}. \quad (21)$$

The Q matrix is defined as follows $$Q = \begin{vmatrix} H & I_3 \\ I_5 & 0 \end{vmatrix} \quad (22)$$

$$\begin{vmatrix} 1 & 0 & 1 & 0 & 1 & 1 & 0 & 0 \\ 1 & 1 & 1 & 1 & 0 & 0 & 1 & 0 \\ 1 & 0 & 1 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \end{vmatrix}.$$

Gaussian elimination to obtain an $I_3$ matrix in the last three rows of H in Q is performed by exchanging the third and fifth columns of Q to yield $$Q_1 = \begin{vmatrix} 1 & 0 & 1 & 0 & 1 & 1 & 0 & 0 \\ 1 & 1 & 0 & 1 & 1 & 0 & 1 & 0 \\ 1 & 0 & 0 & 0 & 1 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 0 & 0 & 1 & 0 & 0 & 0 \\ 0 & 0 & 0 & 1 & 0 & 0 & 0 & 0 \\ 0 & 0 & 1 & 0 & 0 & 0 & 0 & 0 \end{vmatrix}. \tag{23}$$

Then, the third row of $Q_1$ is added to the first row of $Q_1$ to yield $$Q_2 = \begin{vmatrix} 0 & 0 & 1 & 0 & 0 & 1 & 0 & 1 \\ 1 & 1 & 0 & 1 & 1 & 0 & 1 & 0 \\ 1 & 0 & 0 & 0 & 1 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 0 & 0 & 1 & 0 & 0 & 0 \\ 0 & 0 & 0 & 1 & 0 & 0 & 0 & 0 \\ 0 & 0 & 1 & 0 & 0 & 0 & 0 & 0 \end{vmatrix}. \tag{24}$$

Finally, the third row of $Q_2$ is added to the first row of $Q_2$ to yield $$Q_3 = \begin{vmatrix} 0 & 0 & 1 & 0 & 0 & 1 & 0 & 1 \\ 0 & 1 & 0 & 1 & 0 & 0 & 1 & 1 \\ 1 & 0 & 0 & 0 & 1 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 0 & 0 & 1 & 0 & 0 & 0 \\ 0 & 0 & 0 & 1 & 0 & 0 & 0 & 0 \\ 0 & 0 & 1 & 0 & 0 & 0 & 0 & 0 \end{vmatrix}. \tag{25}$$

As shown in equation 25, the matrix defined in rows 1 to 3, columns 2 to 5 of $Q_3$ is the $I_3$ matrix.

From equation 25, the B matrix can be extracted, as follows $$B = \begin{vmatrix} 1 & 0 & 0 & 0 & 0 \\ 0 & 1 & 0 & 0 & 0 \\ 0 & 0 & 0 & 0 & 1 \\ 0 & 0 & 0 & 1 & 0 \\ 0 & 0 & 1 & 0 & 0 \end{vmatrix}, \tag{26}$$

where $$B^T = \begin{vmatrix} 1 & 0 & 0 & 0 & 0 \\ 0 & 1 & 0 & 0 & 0 \\ 0 & 0 & 0 & 0 & 1 \\ 0 & 0 & 0 & 1 & 0 \\ 0 & 0 & 1 & 0 & 0 \end{vmatrix}. \tag{27}$$

Also from equation 25, $$A = \begin{vmatrix} 1 & 0 & 1 \\ 0 & 1 & 1 \\ 0 & 0 & 1 \end{vmatrix}, \tag{28}$$

-continued $$H_s = | P \quad I_3 | = \begin{vmatrix} 0 & 0 & 1 & 0 & 0 \\ 0 & 1 & 0 & 1 & 0 \\ 1 & 0 & 0 & 0 & 1 \end{vmatrix},$$

$$P = \begin{vmatrix} 0 & 0 \\ 0 & 1 \\ 1 & 0 \end{vmatrix},$$

$$P^T = \begin{vmatrix} 0 & 0 & 1 \\ 0 & 1 & 0 \end{vmatrix}.$$

From the matrices for $P^T$ and $B^T$ in equations 28 and 27, respectively, the G matrix is determined as follows $$G = | I_2 \quad P^T | \cdot B^T = \begin{vmatrix} 1 & 0 & 1 & 0 & 0 \\ 0 & 1 & 0 & 1 & 0 \end{vmatrix}. \tag{29}$$

II. Error Correction

In this embodiment, an EDC is used to perform error correction of a coded bit string. This is advantageous, since EDCs require fewer bits, and thus take up less storage space and bandwidth than error correction codes ("ECCs").

One EDC that may be used is based on the number of parity bits added to a bit string to code that bit string. This EDC requires that all coded bit strings have an even number of ones. A parity bit is therefore added to each bit string to ensure that the bit string complies with this condition. For example, assume that the uncoded bit strings are two bits long. A third, parity bit is added to each two-bit string in order to code the string, thus making the bit string three bits long. If the number of ones in the two-bit string is even, a zero is added to the two-bit string, which keeps the number of ones even. If the number of ones in the two-bit string is odd, a one is added to the two-bit string, thereby making the number of ones even.

Figure 7:
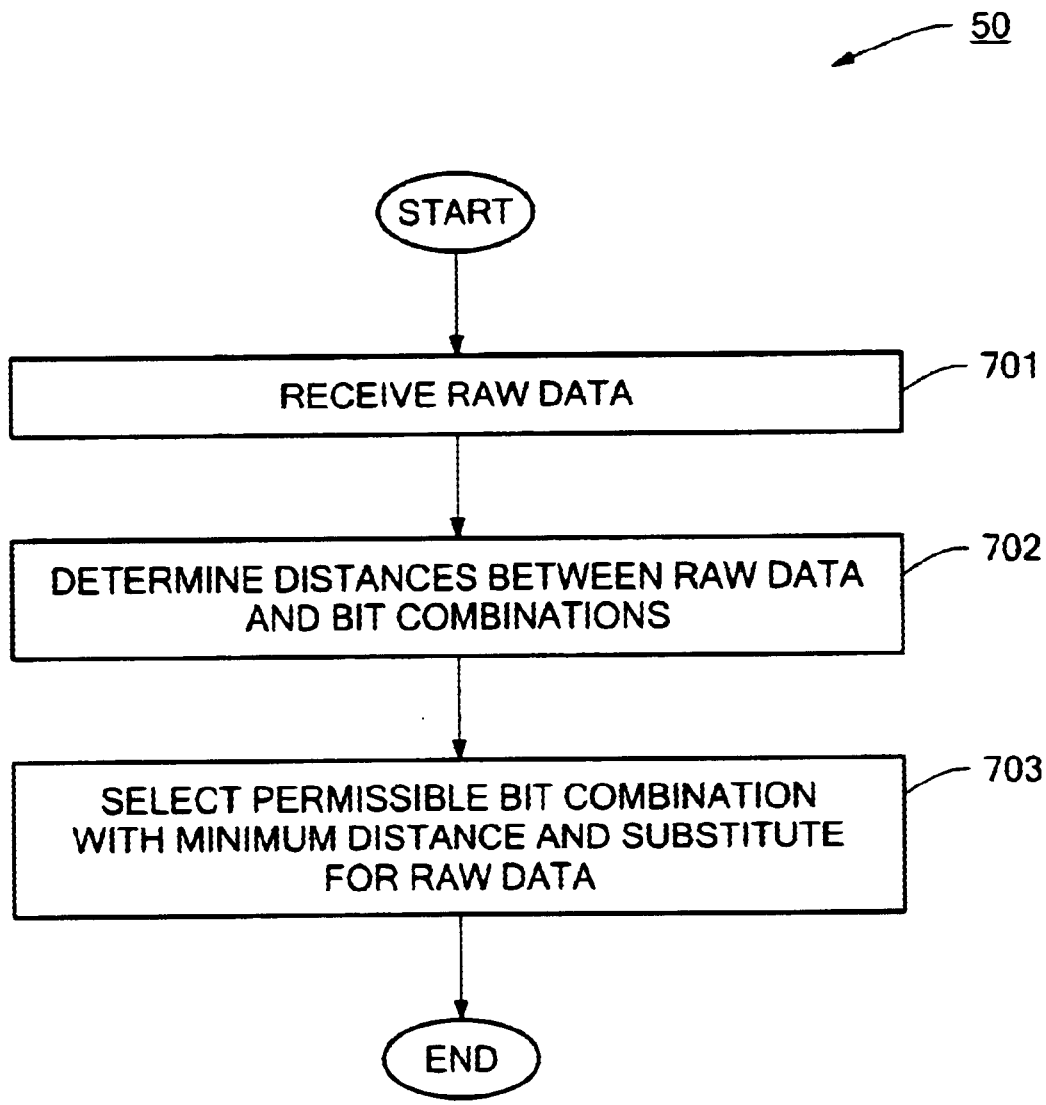
FIG. 7 is a flow diagram showing a process for using an error detection code to perform error correction.

At an error detector, the number of ones in each bit string is checked in order to determine if the number is odd (in which case there is an error in the bit string) or even (in which case it is likely that there is no error in the bit string). FIG. 7 shows a process 50 that uses such an EDC to perform error correction. This process may be executed in a decoder which receives "soft" data.

In step 701, process 50 receives raw data read from a data storage medium. This data may be amplified and filtered, as described above. For this example, we will assume that the data has voltage values of 0.1 V, 0.9 V, and 0.3 V. In step 702, process 50 determines the "distances" between the voltage values and permissible bit combinations. What is meant by "distance" here is the sum of the differences between the voltage values and discrete values of zero or one. What is meant by "permissible" bit values here are bit string combinations that are permitted by the EDC, i.e., bit strings with even numbers of ones are permitted and bit strings with odd numbers of ones are not permitted. Distances need not be determined for non-permissible bit combinations since, by definition, such bit combinations will be erroneous.

Thus, for example, the distance between 0.1, 0.9, and 0.3 and bit combination [011] is determined as follows $$\text{Distance} = [0.1 - 0] + [1 - 0.9] + [1 - 0.3] \qquad (30)$$
$$= 0.1 + 0.1 + 0.7$$
$$= 0.9.$$

The distances for the remaining permissible bit combinations (meaning, in this example, bit combinations with even numbers of ones) of [000], [101] and [110] are as follows $$[000] = 1.3 \qquad (31)$$
$$[101] = 2.5$$
$$[110] = 1.3.$$

In step 703, the permissible bit combination with the minimum distance is selected and substituted for the data. In the foregoing example, since [011] has the minimum distance (0.9), it is substituted for 0.1, 0.9, and 0.3. This process is repeated for remaining coded bit strings The invention is not limited to the hardware, software, or specific examples described in the above embodiments. FIG. 5 is meant merely to illustrate one way for the invention to operate. For example, the steps of FIG. 5 can be reordered, particularly those steps related to selecting errors and element values for multiplication. Similarly, fewer or additional steps may be included in the process depending upon the particular implementation. For example, process 49 of FIG. 5 can stop, for each column, once it determines acceptable bit values for that column.

The invention can be used to detect and correct errors, including burst errors, in any storage medium, such as Markov channels, Gilbert-Elliot channels, and ARQ (Automatic Repeat Request) channels. However, the invention is not limited to use with data storage systems. In fact, it can be used to detect and correct errors in any system where errors may occur. For example, the invention can be used by a receiver to detect and correct bit errors in a communication system, a satellite transmission system, or the like. Also, the invention is not limited to the EDC described in section II above. Any EDC can be used.

Other embodiments not described herein are also within the scope of the following claims.

What is claimed is:

1. A method of generating a parity check matrix for detecting errors in a coded string of bits, the method comprising:
   selecting values for elements in a column of the parity check matrix;
   processing one of one or more predefined errors with the selected values in order to produce a syndrome; and
   assigning the selected values to the column of the parity check matrix if an element of the syndrome has a value indicative of the one predefined error.

2. The method of claim 1, wherein processing comprises multiplying the one predefined error by the selected value.

3. The method of claim 1, wherein, if the element has a value that is not indicative of the one predefined error, the method further comprises:
   selecting different values for the elements in the column; and
   repeating the processing and the assigning using the different values.

4. The method of claim 1, further comprising:
   selecting a new predefined error; and
   repeating the selecting, the processing, and the assigning with the new predefined error.

5. The method of claim 1, wherein the selecting, the processing, and the assigning start at a last column of the parity check matrix and proceed, column-by-column, to a first column of the parity check matrix.

6. The method of claim 5, wherein:
   the predefined error is included in an n-bit (n>1) string when the predefined error is processed with the selected values; and
   the method further comprises re-positioning the predefined error within the n-bit string when the predefined error is processed with a different column of the parity check matrix.

7. The method of claim 1, wherein:
   the values for elements in the column comprise bit combinations that are possible for the column; and
   the selecting comprises selecting each possible bit combination, in turn, for processing.

8. The method of claim 1, further comprising determining, from the parity check matrix, a generation matrix for coding strings of bits.

9. The method of claim 1, wherein the predefined errors have different lengths.

10. A method of detecting an error in a coded string of bits, comprising:
    generating a parity check matrix based on a predefined error;
    processing the string of bits with the parity check matrix to produce a syndrome having one or more elements; and
    determining if a syndrome element has a value indicative of the predefined error.

11. The method of claim 10, wherein processing comprises multiplying the string of bits by the parity check matrix.

12. The method of claim 10, wherein, for a column of the parity check matrix, generating comprises:
    selecting values for elements in the column;
    processing the predefined error with the selected values in order to produce syndrome elements; and
    assigning the selected values to the parity check matrix if a syndrome element has a value indicative of the predefined error.

13. The method of claim 10, wherein an element $h_i$ ($i \geq 1$) in a column of the parity check matrix is selected such that:

$$h_i \neq \sum_{k=2}^{\min(l_j, n-i)} h_{i+k-1} e_{jk} \quad \text{for } 1 \leq j \leq M,$$

where l is a number of bits in an error, n is a number of bits in the coded string, M is a number of predefined errors, and e is a bit in a current error.

14. The method of claim 10, wherein a portion of the parity check matrix comprises an identity matrix.

15. A method of coding a string of bits for error detection, comprising:
    generating a parity check matrix which is usable to detect predefined errors;
    determining a generation matrix from the parity check matrix; and
    processing the string of bits with the generation matrix.

16. The method of claim 15, wherein processing comprises multiplying the string of bits by the generation matrix.

17. The method of claim 15, wherein, for a predefined error, a column of the parity check matrix is generated by:

selecting values for elements in the column;

processing the predefined error with the selected values in order to produce syndrome elements; and assigning the selected values to the parity check matrix if a syndrome element has a value indicative of the predefined error.

18. A method of using an error detection code to correct a coded bit string, comprising:

receiving data for the coded bit string;

determining distances between the data and bit combinations corresponding to the data; and selecting, to substitute for the data, a bit combination that is permitted by the error detection code and that has a minimum distance.

19. The method of claim 18, wherein the error detection code requires that a number of bits in the coded bit string comply with a condition.

20. The method of claim 19, wherein the condition is that the coded bit string have an even number of ones.

21. A computer program stored on a computer-readable medium for generating a parity check matrix for detecting errors in a coded string of bits, the computer program comprising instructions that cause a computer to:

select values for elements in a column of the parity check matrix;

process one of one or more predefined errors with the selected values in order to produce a syndrome; and assign the selected values to the column of the parity check matrix if an element of the syndrome has a value indicative of the one predefined error.

22. The computer program of claim 21, wherein processing comprises multiplying the one predefined error by the selected value.

23. The computer program of claim 21, wherein the computer program further comprises instructions that cause the computer to:

select different values for the elements in the column if the element has a value that is not indicative of the one predefined error; and repeat the processing and the assigning using the different values.

24. The computer program of claim 21, further comprising instructions that cause the computer to:

select a new predefined error; and repeat the selecting, the processing, and the assigning with the new predefined error.

25. The computer program of claim 21, wherein the selecting, the processing, and the assigning start at a last column of the parity check matrix and proceed, column-by-column, to a first column of the parity check matrix.

26. The computer program of claim 25, wherein:

the predefined error is included in an n-bit (n>1) string when the predefined error is processed with the selected values; and the computer program further comprises instructions that cause the computer to re-position the predefined error within the n-bit string when the predefined error is processed with a different column of the parity check matrix.

27. The computer program of claim 21, wherein:

the values for elements in the column comprise bit combinations that are possible for the column; and the selecting comprises selecting each possible bit combination, in turn, for processing.

28. The computer program of claim 21, further comprising instructions that cause the computer to determine, from the parity check matrix, a generation matrix for coding strings of bits.

29. The computer program of claim 21, wherein the predefined errors have different lengths.

30. A computer program stored on a computer-readable medium for detecting an error in a coded string of bits, the computer program comprising instructions that cause the computer to:

generate a parity check matrix based on a predefined error;

process the string of bits with the parity check matrix to produce a syndrome having one or more elements; and determine if a syndrome element has a value indicative of the predefined error.

31. The computer program of claim 30, wherein processing comprises multiplying the string of bits by the parity check matrix.

32. The computer program of claim 30, wherein, for a column of the parity check matrix, generating comprises:

selecting values for elements in the column;

processing the predefined error with the selected values in order to produce syndrome elements; and assigning the selected values to the parity check matrix if a syndrome element has a value indicative of the predefined error.

33. The computer program of claim 30, wherein an element $h_i$ ($i \geq 1$) in a column of the parity check matrix is selected such that:

$$h_i \neq \sum_{k=2}^{\min(l_j, n-i)} h_{i+k-1} e_{jk} \quad \text{for } 1 \leq j \leq M,$$

where l is a number of bits in an error, n is a number of bits in the coded string, M is a number of predefined errors, and e is a bit in a current error.

34. The computer program of claim 30, wherein a portion of the parity check matrix comprises an identity matrix.

35. A computer program stored on a computer-readable medium for coding a string of bits for error detection, the computer program comprising instructions that cause the computer to:

generate a parity check matrix which is usable to detect predefined errors;

determine a generation matrix from the parity check matrix; and process the string of bits with the generation matrix.

36. The computer program of claim 35, wherein processing comprises multiplying the string of bits by the generation matrix.

37. The computer program of claim 35, wherein, for a predefined error, a column of the parity check matrix is generated by:

selecting values for elements in the column;

processing the predefined error with the selected values in order to produce syndrome elements; and assigning the selected values to the parity check matrix if a syndrome element has a value indicative of the predefined error.

38. A computer program stored on a computer-readable medium for using an error detection code to correct a coded bit string, the computer program comprising instructions that cause the computer to:

receive data for the coded bit string;
determine distances between the data and bit combinations corresponding to the data; and
select, to substitute for the data, a bit combination that is permitted by the error detection code and that has a minimum distance.

39. The computer program of claim 38, wherein the error detection code requires that a number of bits in the coded bit string comply with a condition.

40. The computer program of claim 39, wherein the condition is that the coded bit string have an even number of ones.

41. An apparatus for generating a parity check matrix for detecting errors in a coded string of bits, the apparatus comprising:
means for selecting values for elements in a column of the parity check matrix;
means for processing one of one or more predefined errors with the selected values in order to produce a syndrome; and
means for assigning the selected values to the column of the parity check matrix if an element of the syndrome has a value indicative of the one predefined error.

42. The apparatus of claim 41, wherein the predefined errors have different lengths.

43. An apparatus for generating a parity check matrix for detecting errors in a coded string of bits, the apparatus comprising:
a memory which stores computer instructions; and
a processor which executes the computer instructions to (i) select values for elements in a column of the parity check matrix, (ii) process one of one or more predefined errors with the selected values in order to produce a syndrome, and (iii) assign the selected values to the column of the parity check matrix if an element of the syndrome has a value indicative of the one predefined error.

44. The apparatus of claim 43, wherein processing comprises multiplying the one predefined error by the selected value.

45. The apparatus of claim 43, wherein, if the element has a value that is not indicative of the one predefined error, the processor executes computer instructions to (i) select different values for the elements in the column, and (ii) repeat the processing and the assigning using the different values.

46. The apparatus of claim 43, wherein the processor executes computer instructions to (i) select a new predefined error, and (ii) repeat the selecting, the processing, and the assigning with the new predefined error.

47. The apparatus of claim 43, wherein the selecting, the processing, and the assigning start at a last column of the parity check matrix and proceed, column-by-column, to a first column of the parity check matrix.

48. The apparatus of claim 47, wherein:
the predefined error is included in an n-bit (n>1) string when the predefined error is processed with the selected values; and
the processor executes computer instructions to re-position the predefined error within the n-bit string when the predefined error is processed with a different column of the parity check matrix.

49. The apparatus of claim 43, wherein:
the values for elements in the column comprise bit combinations that are possible for the column; and
the selecting comprises selecting each possible bit combination, in turn, for processing.

50. The apparatus of claim 43, wherein the processor executes computer instructions to determine, from the parity check matrix, a generation matrix for coding strings of bits.

51. An apparatus for detecting an error in a coded string of bits, comprising:
a memory which stores computer instructions; and
a processor which executes the computer instructions to (i) generate a parity check matrix based on a predefined error, (ii) process the string of bits with the parity check matrix to produce a syndrome having one or more elements, and (iii) determine if a syndrome element has a value indicative of the predefined error.

52. The apparatus of claim 51, wherein processing comprises multiplying the string of bits by the parity check matrix.

53. The apparatus of claim 51, wherein, for a column of the parity check matrix, generating comprises:
selecting values for elements in the column;
processing the predefined error with the selected values in order to produce syndrome elements; and
assigning the selected values to the parity check matrix if a syndrome element has a value indicative of the predefined error.

54. The apparatus of claim 51, wherein an element $h_i$ ($i \geq 1$) in a column of the parity check matrix is selected such that:

$$h_i \neq \sum_{k=2}^{\min(l_j, n-i)} h_{i+k-1} e_{jk} \quad \text{for } 1 \leq j \leq M,$$

where l is a number of bits in an error, n is a number of bits in the coded string, M is a number of predefined errors, and e is a bit in a current error.

55. The apparatus of claim 51, wherein a portion of the parity check matrix comprises an identity matrix.

56. An apparatus for coding a string of bits for error detection, comprising:
a memory which stores computer instructions; and
a processor which executes the computer instructions to (i) generate a parity check matrix which is usable to detect predefined errors, (ii) determine a generation matrix from the parity check matrix, and (iii) to process the string of bits with the generation matrix.

57. The apparatus of claim 56, wherein processing comprises multiplying the string of bits by the generation matrix.

58. The apparatus of claim 56, wherein, for a predefined error, a column of the parity check matrix is generated by:
selecting values for elements in the column;
processing the predefined error with the selected values in order to produce syndrome elements; and
assigning the selected values to the parity check matrix if a syndrome element has a value indicative of the predefined error.

59. An apparatus for using an error detection code to correct a coded bit string, comprising:
a memory which stores computer instructions; and
a processor which executes the computer instructions to (i) receive data for the coded bit string, (ii) determine distances between the data and bit combinations corresponding to the data, and (iii) select, to substitute for the data, a bit combination that is permitted by the error detection code and that has a minimum distance.

60. The apparatus of claim 59, wherein the error detection code requires that a number of bits in the coded bit string comply with a condition.

61. The apparatus of claim 60, wherein the condition is that the coded bit string have an even number of ones.

* * * * *